United States Patent
Sandström et al.

(10) Patent No.: US 6,700,600 B1
(45) Date of Patent: Mar. 2, 2004

(54) BEAM POSITIONING IN MICROLITHOGRAPHY WRITING

(75) Inventors: Torbjörn Sandström, Pixbo (SE); Leif Odselius, Upplands Väsby (SE); Peter Ekberg, Lidingö (SE); Stefan Gullstrand, Danderyd (SE); Mattias Israelsson, Stockholm (SE); Ingvar Andersson, Stockholm (SE)

(73) Assignee: Micronic Laser Systems AB, Taby (SE)

( * ) Notice: Subject to any disclaimer, the term of this patent is extended or adjusted under 35 U.S.C. 154(b) by 0 days.

(21) Appl. No.: 10/130,344

(22) PCT Filed: Nov. 17, 2000

(86) PCT No.: PCT/SE00/02254

§ 371 (c)(1),
(2), (4) Date: May 17, 2002

(87) PCT Pub. No.: WO01/37051

PCT Pub. Date: May 25, 2001

(30) Foreign Application Priority Data

Nov. 17, 1999 (SE) .............................................. 9904186

(51) Int. Cl.[7] ........................... B41J 2/47; G01D 15/34; G02B 26/00; G02B 27/00
(52) U.S. Cl. ..................................................... 347/256
(58) Field of Search ................................. 347/256, 260, 347/255, 239, 243, 259, 134, 135, 132, 131, 130, 129, 112, 225

(56) References Cited

U.S. PATENT DOCUMENTS

| | | |
|---|---|---|
| 4,541,712 A | 9/1985 | Whitney |
| 4,912,487 A | 3/1990 | Porter et al. |
| 5,067,798 A | 11/1991 | Tomoyasu |

FOREIGN PATENT DOCUMENTS

| | | |
|---|---|---|
| EP | 0 444 665 A2 | 9/1991 |
| EP | 0 818 814 A2 | 1/1998 |
| FR | 2 530 354 A1 | 1/1984 |

*Primary Examiner*—Raquel Yvette Gordon
(74) *Attorney, Agent, or Firm*—Birch, Stewart, Kolasch & Birch, LLP (57) ABSTRACT

The present invention relates to a system and a method for microlithographic writing and inspection on photosensitive substrates, and specially printing and inspection of patterns with extremely high precision, such as photomasks for semiconductor device patterns, display panels, integrated optical, devices and electronic interconnect structures. More specifically the invention relates to compensation of substrate offset by modifying the position data or the feeding of the same of the deflector, and the use of a direct digital synthesis (DDS) unit for generation of the sweep frequency drive signal.

30 Claims, 4 Drawing Sheets

Fig 8

BEAM POSITIONING IN MICROLITHOGRAPHY WRITING

This application is the national phase under 35 U.S.C. § 371 of PCT International Application No. PCT/SE00/02254 which has an International filing date of Nov. 17, 2000, which designated the United States of America.

FIELD OF THE INVENTION

The present invention relates to a system and a method for microlithographic writing and inspection on photosensitive substrates, and specially printing and inspection of patterns with extremely high precision, such as photomasks for semiconductor device patterns, display panels, integrated optical devices and electronic interconnect structures. The terms writing and printing should be understood in a broad sense, meaning exposure of photoresist and photographic emulsion, but also the action of light on other light sensitive media such as dry-process paper, by ablation or chemical processes activated by light or heat. Light is not limited to mean visible light, but a wide range of wavelengths from infrared to extreme UV.

BACKGROUND OF THE INVENTION

A system and method for microlithographic writing of a substrate is previously known from e.g. EP 0 467 076 by the same applicant. In general such a system for microlithographic writing comprises a light source, such as a laser, a modulator to produce the desired pattern to be written, the modulator being controlled according to input pattern data, an acousto-optic deflector driven by a sweep frequency signal to scan the beam over the substrate according to a set of data indicating consecutive positions of the beam, and a lens to focus the beam before it reach the substrate. Further, the substrate is arranged on an object table, and the table (stage) is controlled by a servo system to be moved in a direction perpendicular to the scanning direction of the beam.

However, a problem with such known writing systems are that the table does not always perform a linear motion, and it is also possible that the table movement is not perpendicular to the scanning direction, but is made in another oblique angle.

A solution to this problem has been proposed by Whitney in U.S. Pat. No. 4,541,712, where the data to control the modulator is delayed in accordance with an offset measured for the substrate table. Hence, in this case the problem is handled by means of a timing control. However, this method is not feasible to use in all systems. It is further a problem with this known method that due to the delay function extra time has to be added at the beginning and the end of each sweep, whereby the time efficiency of the process is deteriorated. As a consequence, a less number of resolved pattern features per scan could be obtained as well.

It is further a related problem with the prior art that it is difficult to provide a reliable, accurate and effective translation from the input beam position data to an output sweep frequency signal to be used by the acousto-optic modulator to correctly direct the beams towards the substrate. This translation has heretofore normally been provided by a series of components, comprising a digital to analog converter (DAC) and a voltage controlled oscillator (VCO). These components, and especially the VCO, are non-linear, and are also sensible for changes in temperature, disturbances from other electronic components etc. Further, the VCO has an inherent analog "inertia" preventing fast changes. Due to these and other problems with the translation from the input beam position data to an output sweep frequency signal the control of the deflector is deteriorated as well.

Raster-scanning inspection systems have a similar structure, and does hence experience similar problems.

SUMMARY OF THE INVENTION

It is therefore an object of the present invention to provide a system and a method in which the above mentioned problems of the prior art are solved or at least alleviated.

This object is achieved with a system and a method according to the appended claims.

According to a first aspect of the invention a laser scanning system for microlithographic writing or inspection of patterns on a photosensitive substrate is provided. The system comprises a laser light source generating at least one laser light beam, a computer-controlled light modulator controlled according to input pattern data, a lens to focus the light beam from the light source before it reaches the substrate, and a substrate support table to support the substrate. During the writing operation, the at least one beam is deflected across a region of the substrate surface by an acousto-optic deflector driven by a sweep frequency signal according to a set of data indicating consecutive positions of the beam on the substrate, and the substrate is moved in an oblique angel, and preferably perpendicular, to the direction of deflection to reposition it for exposure during the next stroke of the beams. Further, the system comprises at least one sensor measuring the extent of substrate offset in the direction of deflection, means for modifying the position data or the feeding of the data to correspond to laterally displaced scans and a control unit for controlling the reading out of the data to the deflector in dependence of the offset measured by the detector to compensate said offset. The laser source and the modulator may be integrated in one unit. Further, the means for modifying the data preferably comprises means for generating different sets of data. Hence, the offset compensation is achieved by controlling the deflector instead of the modulator.

Thus, the compensation for the measured offset is preferably not made by timing control, but rather by adding delays to the input data, or by choosing one of several possible sets of input position data, having different properties. Hereby, no extra compensation time is needed at the beginning and the end of each sweep, whereby the time is used more efficiently and the possible number of resolved pattern features per scan is improved.

According to a preferred embodiment of the invention, the laser scanning system comprises several data storage means for storing the different sets of data, and the control unit comprising a selector, selecting one of the data storage means data to read out to the deflector in dependence of the offset measured by the detector to compensate said offset. Alternatively the control unit comprises an adder to modify the position data in accordance with the measured offset, preferably in real-time, thus generating modified data to read out to the deflector to compensate said offset.

According to another aspect of the invention, a laser scanning system for microlithographic writing or inspection of patterns on a photosensitive substrate is provided. The system comprises a laser light source generating at least one laser light beam, a computer-controlled light modulator controlled according to input pattern data, a lens to focus the light beam from the light source before it reaches the substrate, and a substrate support table to support the substrate. During the writing operation, the at least one beam is deflected across a region of the substrate surface by an acousto-optic deflector driven by a sweep frequency signal according to a set of data indicating consecutive positions of the beam on the substrate, and the substrate is moved in an oblique angel, and preferably perpendicular, to the direction of deflection to reposition it for exposure during the next stroke of the beams. Further, the system comprises at least one sensor measuring the extent of substrate offset in the direction of deflection, and a direct digital synthesis (DDS) unit for generation of the initiation of the chirp, the DDS unit in turn being controlled by input data indicating the start of the sweep.

The DDS has a very suitable performance for this application, since it could perform the translation directly from input data to an output frequency signal, and thus replace several other components normally used. The DDS is further very stable, and is not as affected by disturbances in the environment as other components. Still further, the translation in the DDS is essentially linear, and the response time to changing data is very short.

Most preferably, however, said two aspects of the invention is used as a combination.

Further, the system preferably comprises a first high-frequency generator generating a first high-frequency signal and a mixer for mixing, i.e. adding or subtracting, the drive signal with the DDS to the high-frequency signal. Hereby, a low-frequency DDS, which is much cheaper and also more reliable and accurate, could be used, at the same time as the output frequency could still be maintained in a suitable range for driving an acousto-optic device in the writing or inspection process, typically 100–250 MHz.

It is further preferred that the high-frequency generator and the DDS unit are supplied with synchronised clock signals, and most preferably clock signals originating from the same clock. Hereby, synchronisation in the translation process could be maintained.

Still further, the system further comprises a second high-frequency generator generating a second high-frequency signal and a mixer for mixing the drive signal from the DDS, after the addition to the first high-frequency signal, from the second high-frequency signal. Hereby the relative range of the output frequency could be increased.

It is also preferred that the system comprises at least one unit for frequency multiplication, e.g. a mixer for mixing the input signal with itself, and this mixer preferably being placed between the mixers for mixing with the first and second high-frequency signals. This also increases the absolute range of the output frequency.

According to a preferred embodiment of the invention the computer-controlled light modulator and the DDS unit are further supplied with synchronised clock signals, and most preferably clock signals originating from the same clock. Thanks to this, the modulator and the deflector could be maintained in synchronisation throughout the entire writing or inspection process. Hereby uncertainty due to timing uncertainty between data and scan is avoided.

The invention also makes it possible to obtain two or more RF-signals with controlled phase-difference. Such phase-controlled signals could be used to extend the useful bandwidth of an acousto-optic deflector by so-called phased array driving. This could be accomplished by using at least two DDS units controlled by different input data in the system. Hereby, the input data to the channels have a small computed difference that creates a phase-difference. The two DDS units are preferably phase-synchronised at regular intervals and the same RF signals are used for up and down converting in the two units. In this way it is possible to create two signals with an extremely accurate phase-coherence but still having an arbitrary accurately controlled phase-difference. It could however also be obtained by a single DDS, a signal splitter and one or more phase-modulators as is well known in the RF-technology.

According to still another aspect of the invention a method for microlithographic writing with a laser scanning system of patterns on a photosensitive substrate is provided, the system comprising a laser light source, a computer-controlled light modulator controlled according to input pattern data, and a lens to focus the light beam from the light source before it reaches the substrate. During the writing operation, the at least one beam is deflected across a region of the substrate surface by an acousto-optic deflector driven by a sweep frequency signal according to a set of data indicating consecutive positions of the beam on the substrate, and the substrate is moved in an oblique angel, and preferably perpendicular, to the direction of deflection to reposition it for exposure during the next stroke of the beams; and the extent of substrate offset,in the direction of deflection is measured. Further, the method comprises the steps of generating sets of the position data corresponding to laterally displaced scans, and selecting one of said sets of position data to read out to the deflector in dependence of the offset measured by the detector to compensate said offset.

According to still another aspect of the invention, a method for microlithographic writing with a laser scanning system of patterns on a photosensitive substrate is provided, the system comprising a laser light source, a computer-controlled light modulator controlled according to input pattern data, and a lens to focus the light beam from the light source before it reaches the substrate. During the writing operation, the at least one beam is deflected across a region of the substrate surface by an acousto-optic deflector driven by a sweep frequency signal according to a set of data indicating consecutive positions of the beam on the substrate, and the substrate is moved in an oblique angel, and preferably perpendicular, to the direction of deflection to reposition it for exposure during the next stroke of the beams; and the extent of substrate offset in the direction of deflection is measured. Further, the sweep frequency drive signal is generated by a direct digital synthesis (DDS) unit, which in turn is controlled by input data indicating the start of the sweep.

Most preferably the two methods above are used in combination.

SHORT DESCRIPTION OF THE DRAWINGS

For exemplifying purposes, the invention will be described in closer detail in the following with reference to embodiments thereof illustrated in the attached drawings, wherein.

DESCRIPTION OF PREFERRED EMBODIMENTS

Figure 1:
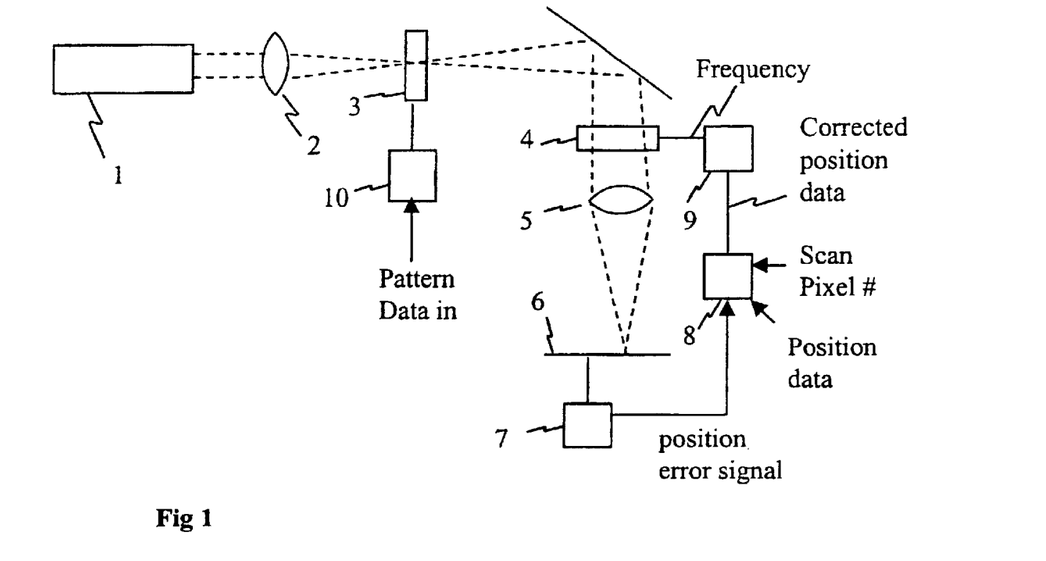
FIG. 1 is a schematic view of a system according to one embodiment of the invention.

Referring to FIG. 1, the system according to the invention comprises a light source 1, which is preferably a continuous laser, a computer-controlled light modulator 3 and a lens 5 to focus the light beam from the light source before it reaches a photosensitive substrate 6. Further it preferably comprises a second contracting lens 2 ahead of the modulator. The laser is e.g. a ion laser, such as a 413 nm, 100 mW krypton ion laser. The modulator controls the beam according to input pattern data, delivered to the modulator by delivery electronics 10.

The system according to the invention is preferably a so called "write on the fly" system, where the substrate is placed on a substrate table, and the substrate table performs a continuous motion in at least one direction during the writing process, and the laser beam is at the same time scanned in another direction. This microlithographic technique is well known in the art, and is generally known as raster scanning. The invention further relates to an inspection system, and such a raster-scanning inspection is performed in essentially the same way. Sensors are in such a system arranged to detect the reflected or transmitted scanning beam, or the laser replaced by the detector, whereby the detector scans the substrate. In this case, the data output is instead reading of data.

The system further comprises an acousto-optic deflector 4 driven by a chirp frequency signal to direct the beams towards the substrate 6 according to a set of data indicating consecutive positions of the beam, and to scan the beam over scan lines at the substrate. The table (stage) is preferably controlled by a servo system or the like to be moved in a direction perpendicular to the scanning direction of the beam.

Alternatively, a beam-splitter (not shown) could be arranged to generate several beam or several beams could be generated by several laser sources. The modulator may also be integrated in the laser. The beams could then be concurrently deflected across the substrate surface by the acousto-optic deflector.

Acousto-optic deflectors are well known in the art, and deflects a significant portion of the energy in the laser beams through a range of angles, the angle of deflection depending upon the frequency of the signal used to drive the acousto-optic deflector.

The extent of substrate offset in the direction of the scanning is measured by at least on sensor 7, such as a laser interferometer or other means for measuring, preferably to within a fraction of a wavelength of the light being used, the position of the table. Accordingly, the sensor generates a position error signal.

The deflector is controlled according to a scan pixel number, normally generated by a counter, position data, and the position error signal, and each initiation of deflection strokes is controlled, so that each portion of the generated pattern begins from a uniform reference line on the substrate surface. Preferably, the position error signal is used to modify the position data signals by compensating means 8, to generate a corrected position data signal to be conveyed to the deflector. This modification is preferably done by modifying the input data, but it is also possible to modify the timing in the feeding of the data. This signal is normally a digital signal, and a translation means 9 translates said digital signal to an analog RF-frequency signal to be used by the acousto-optic deflector.

Figure 2:
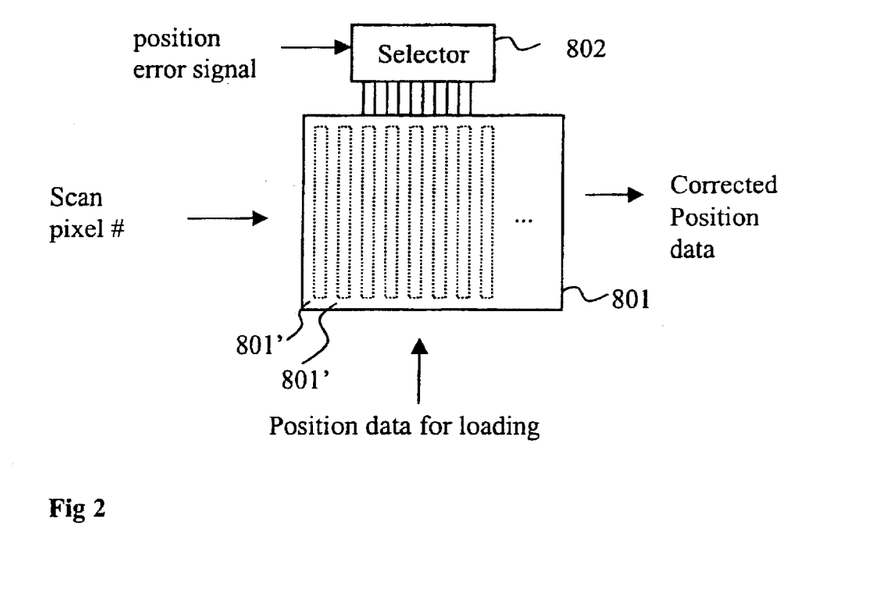
FIG. 2 is a schematic view of a compensation means according to the invention, for compensating position errors for the substrate.

Referring to FIG. 2, a compensation means according to the invention is shown. In this embodiment the compensation means comprises a data storage 801 with several memory areas 801'. However, several separate data storages could be used as well. The memories/memory areas are supplied with data corresponding to laterally displaced scans. Data are thereafter read out to be conveyed to the deflector in an order controlled by an input scan pixel number. Which of the memories/memory areas to read out is however controlled by a selector according to the input position error signal. The output from the compensation means is therefore a corrected position data, where the data is modified in order to compensate for the measured erroneous offset. Such optional memory arrays requires a large storage capacity, but this is however rather inexpensive. Further, non-linearities in the system may hereby be handled and compensated for.

Figure 3:
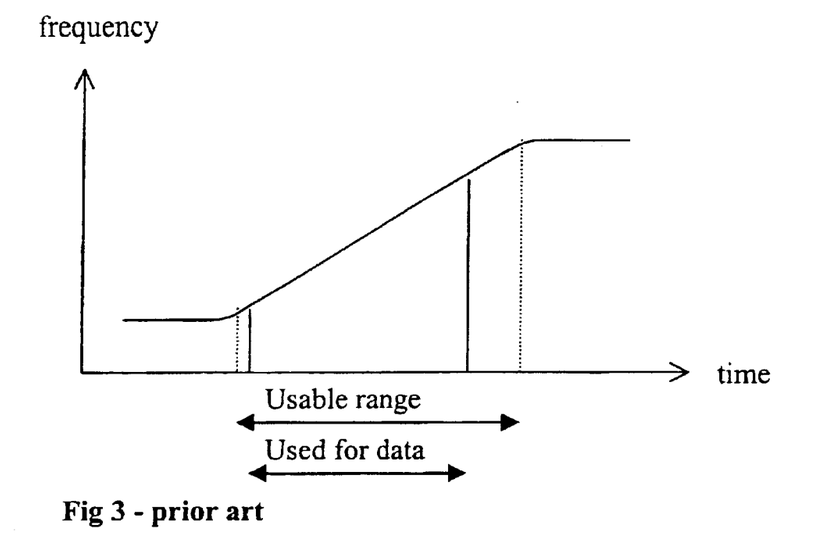
FIG. 3 is a schematic diagram indicating the compensation for position errors used in the prior art.
Figure 4:
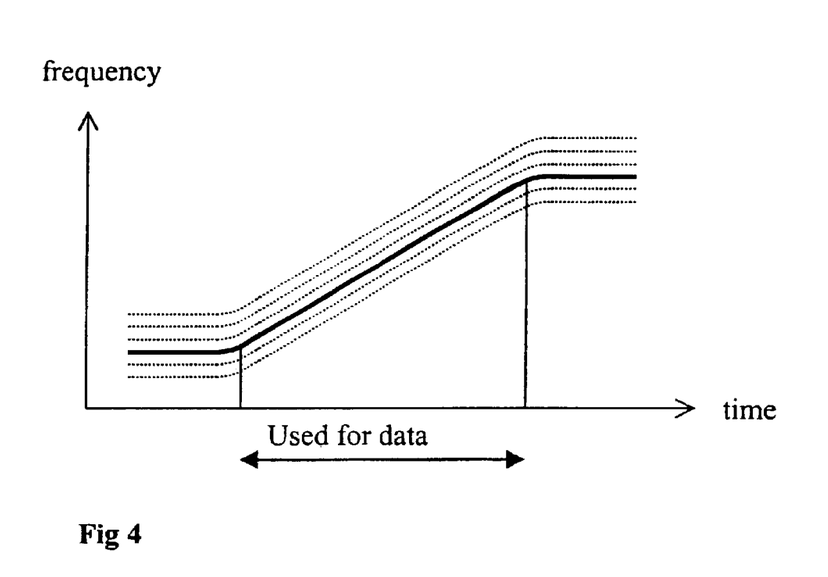
FIG. 4 is a schematic diagram indicating the compensation for position errors used in the invention.

This compensation is thus not made by delaying the data to the modulator, as is known from the prior art, and which is shown schematically in FIG. 3. Instead alternative sets of position data are provided, whereby the choice is made in order to compensate for the measured error. This is illustrated, likewise schematically, in FIG. 4.

Figure 5:
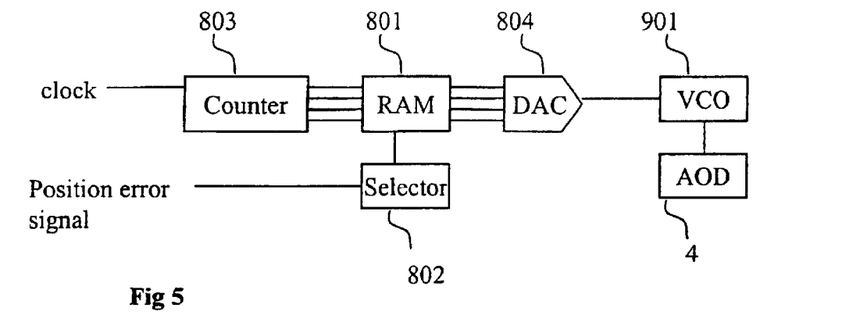
FIG. 5 is a schematic view of a compensation and translation means according to a first embodiment of the invention.

In FIG. 5 is shown a first embodiment of a compensation and translation means according to the invention. It comprises a counter 603 is supplied with a clock signal, and generates a scan pixel number to be used by the compensation means. Further, it comprises a memory, such as a random access memory (RAM), being supplied with input position data (not shown). A selector 802 receives the position error signal and chooses a memory area to read out accordingly. The read out digital signal is converted to an analog signal by a digital to analog converter 804, and this signal is subsequently translated to a RF-signal by a voltage controlled oscillator 901 (VCO), whereafter it is sent to the acousto-optic deflector 4 (AOD).

Figure 6:
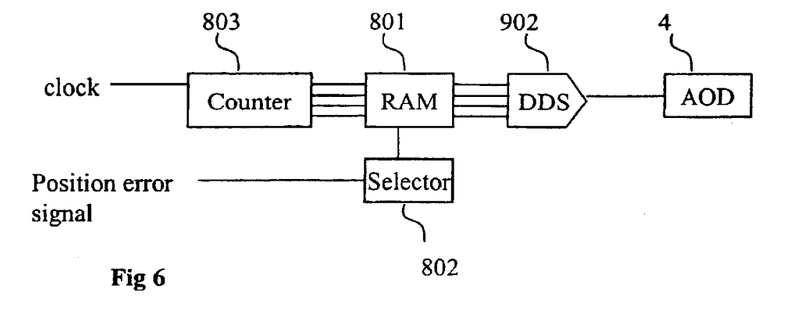
FIG. 6 is a schematic view of a compensation and translation means according to a second embodiment of the invention.

In FIG. 6 is shown a second embodiment of a compensation and translation means according to the invention. This embodiment differs from the first embodiment described above in that it uses a direct digital synthesis (DDS) unit 902 to translate the digital position signal to a RF-signal that could be used by the AOD 4. The DDS has a very suitable performance for this application, since it could perform the translation from input data to an output frequency signal, and thus replace the VCO and the DAC. The DDS is further very stable, and is not as affected by disturbances in the environment as other components. Specifically, the VCO is very sensitive for thermal variations, electronic noise etc. Still further, the translation in the DDS is essentially linear, and is also very fast, and a high frequency resolution is obtained.

A DDS normally comprises a phase-accumulator, a sine-table and a digital-to-analog converter, and is commercially available from e.g. Qualcom corp. and Stanford Telecom corp. In the DDS the phase accumulator comprises an adder and a latch, connected in succession, and the phase accumulator adds a value to its former value at each clock pulse.

The value of the phase accumulator is thus incremented at the clock signal rate, whereby an increasing ramp is formed at the output of the phase accumulator. The accumulator is allowed to overflow. The output of the phase accumulator is connected as a read address to the sine table, wherein a sinusoidal signal cycle has been stored. The digital sinusoidal signal, received from the sine table, is conveyed to the digital-to-analog converter, where it is converted into analog form, whereby a sine-wave is received at the output, and preferably, depending on the frequency, an RF-signal.

Figure 7:
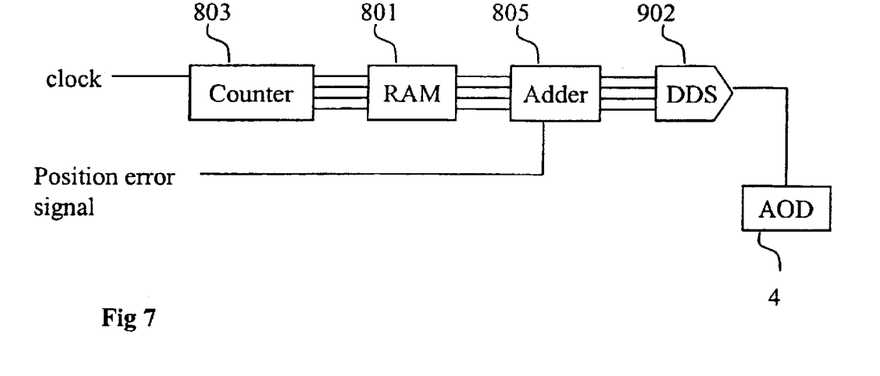
FIG. 7 is a schematic view of a compensation and translation means according to a third embodiment of the invention.

In FIG. 7 a third embodiment of a compensation and translation means according to the invention is shown.

This embodiment differs from the second embodiment described above in that it does not use several prestored sets of position data to compensate according to the position error signal. Instead an adder 805 is used to modify the position data in real-time according to the position error signal. This solution is conceptually easier, but can not handle the case with non-linearities. It is further possible to modify the data or the feeding of the data in other ways.

A problem in using DDS units for the translation from a digital signals to an RF-signal is that DDS-units fast enough to use in the above mentioned application are normally relatively expensive due to the necessary high clock frequency. Further, there are often errors in the output signal and there are problems with the synchronization due to the high clock frequency. Low frequency DDS have signals with much less error rate, and the loading of data is totally synchronized. The low-frequency DDS units are further much less expensive. However, these units could not be used in the above-mentioned application due to their low bandwidth.

These problems with the low-frequency DDS units could however be overcome by using signal conditioning to increase the bandwidth. This could be accomplished by a combination of frequency multiplication and frequency shifting.

Figure 8:
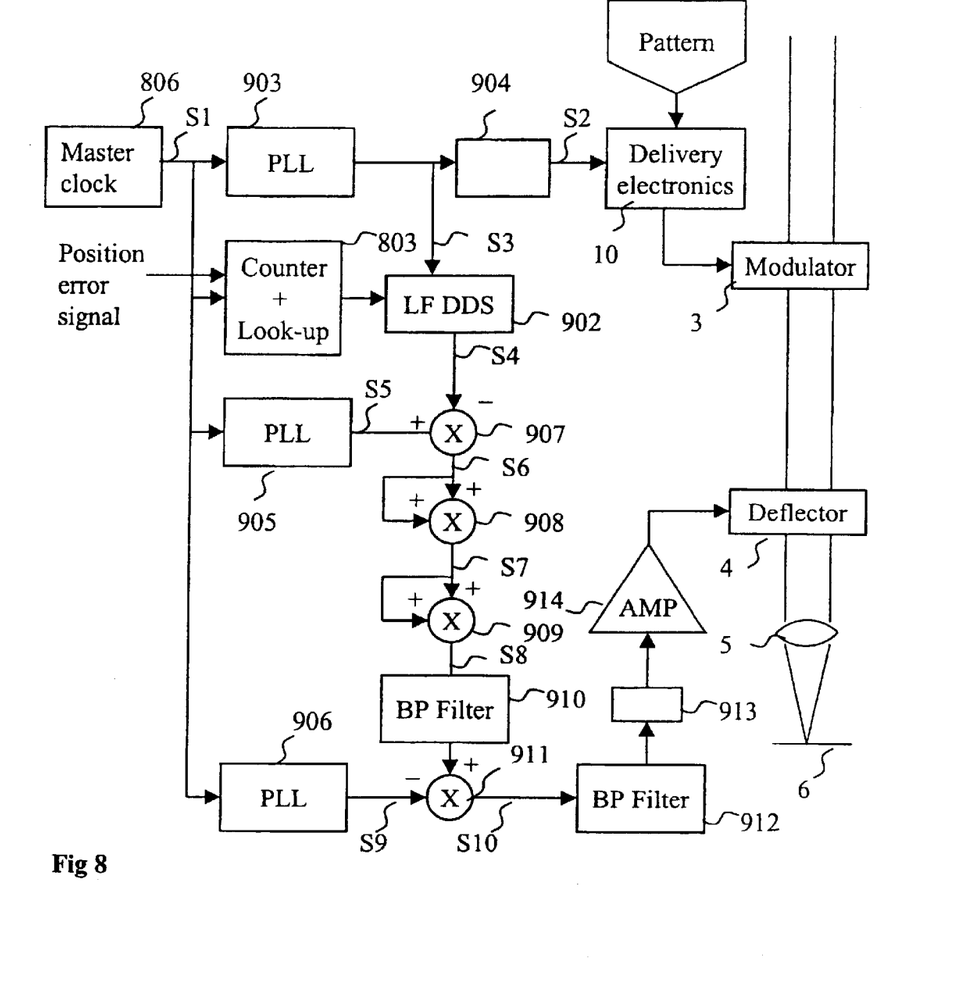
FIG. 8 is a more detailed view of the second and third embodiments shown in FIGS. 6 and 7.

In the preferred embodiment shown in FIG. 8, essentially corresponding to the second and third embodiment discussed above, a low-frequency DDS (LF DDS) unit 901 is used. This unit is supplied with a clock signal from a master clock 806. For example, a 10 MHz master clock could be used, generating a signal S1 with 10 Mhz. This frequency is then preferably increased by using a phase-locked loop (PLL) unit 903, which is well known in the art, to generate a signal S2 of e.g. 200 Mhz. The same signal is then preferably used to control the delivery electronics 10 for feeding the pattern to the modulator 3. Hereby, synchronization could easily be obtained between the modulator 3 and the deflector 4. To be suitable for the modulator, the clock signal could be frequency devided in a unit 904, and e.g. be divided by four.

The signal from the LF DDS 902, S4, could e.g. be in the range 14–64 MHz. This signal is then preferably frequency shifted, which could be obtained by mixing it with a high frequency signal S5 in a mixer 907. The High frequency signal is preferably generated by using the same clock signal S1 in a second PLL 905. If e.g. a high-frequency signal S5 with 315 MHz is used, the range for the signal S6 after the mixing with S4 would be 251–301 MHz.

This signal is thereafter preferably frequency multiplied. For example, a multiplication by two could be obtained by mixing the signal with itself in a mixer 908, and a multiplication with four could be obtained by mixing the signal with itself once again in another mixer 909. In the example used the signal S7 after the first multiplication would then have the range 502–602 MHz, and the signal S8 after the second multiplication 1004–1204 MHz. Other multiplication values could be obtained as well, which would be appreciated by a person skilled in RF-technology.

If needed a bandwidth (BP) filter 910 could thereafter be used to suppress noise and spurious frequencies in the signal.

According to a preferred embodiment the signal is thereafter frequency shifted down again, which could be accomplished by mixing it with second high-frequency signal S9 in yet another mixer 911. This second high-frequency signal is preferably generated from the same clock signal by using a PLL 906. For example the signal S9 could have the frequency of 904 MHz, whereby the resulting signal S10 would have the range 100–300 MHz. Compared to the original signal S4 from the LF DDS, the bandwidth is now significantly increased, from 50 MHz to 200 MHz, and is located in a suitable frequency range.

The signal could then, if necessary, be bandwidth filtered once more, in another BP filter 912, and amplified in an amplifier 914 before it is conveyed to the deflector 4. An amplitude modulator 913 is further provided to control the power in accordance with the frequency.

To increase the bandwidth of the deflector, several DDS units controlled by different input data could be used, to obtain phase-control of the beam-direction. Such phase-control could however also be obtained by using a single DDS, a signal splitter and one or more phase-modulators, whereby the split signal is controlled to obtain phase-control of the beam-direction.

The invention has now been described by way of examples. However, several other alternatives are possible, such as using a DDS unit with other types of substrate offset compensations, such as time delays. Mixing is further to be understood as addition as well as subtraction, and they are equivalent and exchangable. Direct digital synthesis should further be interpreted as comprising even hybrids using combinations of DDS technique and voltage controlled oscillators. Such alternatives should be considered to be within the scope of the invention, as it is defined by the appended claims.

What is claimed is:

1. A laser scanning system for microlithographic writing or inspection of patterns on a photosensitive substrate (6), the system comprising a laser light source (1) generating at least one laser light beam, a computer-controlled light modulator (3) controlled according to input pattern data, a lens to focus the light beam from the light source before it reaches the substrate, and a substrate support table to support the substrate, whereby, during the writing operation, the at least one beam is deflected across a region of the substrate surface by an acousto-optic deflector driven by a chirp frequency signal according to a set of data indicating consecutive positions of the beam on the substrate, and the substrate is moved in an oblique angel, and preferably perpendicular, to the direction of deflection to reposition it for exposure during the next stroke of the beams; and at least one sensor measuring the extent of substrate offset in the direction of deflection, characterised in that it further comprises means for modifying the position data or the feeding of the same to correspond to laterally displaced scans and a control unit for controlling said position data or the feeding of the same to read out the data to the deflector in dependence of the offset measured by the detector to compensate said offset.

2. A laser scanning system according to claim 1, wherein the means for modifying the data comprises means for generating sets of position data corresponding to laterally displaced scans.

3. A laser scanning system according to claim 2, wherein it further comprises several data storage means for storing the different sets of data, and the control unit comprising a selector, selecting one of the data storage means data to read out to the deflector in dependence of the offset measured by the detector to compensate said offset.

4. A laser scanning system according to claim 1, wherein the control unit comprises an adder to modify the position data in accordance with the measured offset, preferably in real-time, thus generating modified data to read out to the deflector to compensate said offset.

5. A laser scanning system according to claim 1, wherein the system further comprises a beam-splitter dividing the laser beam into several beams being swept concurrently over the substrate surface.

6. A laser scanning system according to claim 1, wherein the sweep frequency drive signal is generated by a direct digital synthesis (DDS) unit, which in turn is controlled by input data indicating the start of the sweep.

7. A laser scanning system according to claim 6, wherein the DDS unit comprises a phase accumulator, a memory with a table with values for a waveform, and preferably a sinusoid, and a digital to analog converter (DAC).

8. A laser scanning system according to claim 7, wherein it further comprises at least one unit for frequency multiplication, such as a mixer for mixing the input signal with itself, and this unit preferably being placed between the mixers for mixing with the first and second high-frequency signals.

9. A laser scanning system according to claim 8, wherein the mixer for adding the drive signal from the DDS to itself is arranged after the mixer for mixing the drive signal from the DDS with the high-frequency signal.

10. A laser scanning system according to claim 6, wherein it further comprises a first high-frequency generator generating a first high-frequency signal and a mixer for mixing the drive signal from the DDS with the high-frequency signal.

11. A laser scanning system according to claim 10, wherein the first high-frequency generator comprises a phase-locked loop.

12. A laser scanning system according to claim 6, wherein the computer-controlled light modulator and the DDS unit are supplied with synchronized clock signals originates from the same clock signals.

13. A laser scanning system according to claim 12, wherein the synchronized clock signals originates from the same clock.

14. A laser scanning system according to claim 6, wherein it comprises at least two DDS units controlled by different input data to obtain phase-control of the beam-direction.

15. A method according to claim 14, wherein the computer-controlled light modulator and the DDS unit are supplied with synchronized clock signals.

16. A laser scanning system according to claim 6, wherein a single DDS, a single splitter and one or more phase-modulators, whereby the split signal is controlled to obtain phase-control of the beam-direction.

17. A laser scanning system for microlithographic writing or inspection of patterns on a photosensitive substrate (6), the system comprising a laser light source (1) generating at least one laser light beam, a computer-controlled light modulator (3) controlled according to input pattern data, a lens to focus the light beam from the light source before it reaches the substrate, and a substrate support table to support the substrate, whereby, during the writing operation, the at least one beam is deflected across a region of the substrate surface by an acousto-optic deflector driven by a chirp frequency signal according to a set of data indicating consecutive positions of the beam on the substrate, and the substrate is moved in an oblique angel, and preferably perpendicular, to the direction of deflection to reposition it for exposure during the next stroke of the beams, characterised in that it further comprises a direct digital synthesis (DDS) unit for generation of the sweep frequency drive signal.

18. A laser scanning system according to claim 17, wherein it further comprises at least one sensor measuring the extent of substrate offset in the direction of deflection, whereby the DDS unit is controlled by input data indicating the start of the sweep.

19. A laser scanning system according to claim 10 or 9, wherein the high-frequency generator and the DDS unit are supplied with synchronized clock signals, and preferably clock signals originating from the same clock.

20. A laser scanning system according to claim 18, wherein it comprises a second high-frequency generator generating a second high-frequency signal and a mixer for mixing the drive signal with the DDS, after the mixing with the first high-frequency signal, from the second high-frequency signal.

21. A laser scanning system according to claim 20, wherein the first high-frequency generator comprises a phase-locked loop.

22. A method for microlithographic writing with a laser scanning system of patterns on a photosensitive substrate (6), the system comprising a laser light source (1), a computer-controlled light modulator (3) controlled according to input pattern data, a lens to focus the light beam from the light source before it reaches the substrate, whereby, during the writing operation, the at least one beam is deflected across a region of the substrate surface by an acousto-optic deflector driven by a chirp frequency signal according to a set of data indicating consecutive positions of the beam on the substrate, and the substrate is moved in an oblique angel, and preferably perpendicular, to the direction of deflection to reposition it for exposure during the next stroke of the beams; and whereby the extent of substrate offset in the direction of deflection is measured, characterised by the further steps of modifying the position data or the feeding of the same to correspond to laterally displaced scans in dependence of the offset measured by the detector to compensate said offset.

23. A method according to claim 22, wherein the modification of the position data is obtained by generating sets of position data corresponding to laterally displaced scans, and selecting one of said sets of position data to read out to the deflector.

24. A method according to claim 23, wherein the laser beam is further divided into several beams being swept concurrently over the substrate surface.

25. A method according to claim 24, wherein the drive signal from the DDS is further added to itself.

26. A method according to claim 24, wherein the drive signal from the DDS, after the mixing with the first high-frequency signal, is mixed with a second high-frequency signal.

27. A method according to claim 23, wherein the signal from the DDS unit is further mixed with a first high-frequency signal.

28. A method according to claim 22, wherein the sweep frequency drive signal is generated by a direct digital synthesis (DDS) unit, which in turn is controlled by input data indicating the start of the sweep.

29. A method for microlithographic writing with a laser scanning system of patterns on a photosensitive substrate (6), the system comprising a laser light source (1), a computer-controlled light modulator (3) controlled according to input pattern data, a lens to focus the light beam from the light source before it reaches the substrate, whereby, during the writing operation, the at least one beam is deflected across a region of the substrate surface by an acousto-optic deflector driven by a chirp frequency signal according to a set of data indicating consecutive positions of the beam on the substrate, and the substrate is moved in an oblique angel, and preferably perpendicular, to the direction of deflection to reposition it for exposure during the next stroke of the beams, characterised in that the sweep frequency drive signal is generated by a direct digital synthesis (DDS) unit.

30. A method according to claim 29, wherein it further comprises the step of measuring the extent of substrate offset in the direction of deflection, and to control the DDS by input data indicating the start of the sweep.

* * * * *